(12) United States Patent
Micheloni et al.

(10) Patent No.: US 8,621,318 B1
(45) Date of Patent: Dec. 31, 2013

(54) NONVOLATILE MEMORY CONTROLLER WITH ERROR DETECTION FOR CONCATENATED ERROR CORRECTION CODES

(75) Inventors: Rino Micheloni, Turate (IT); Alessia Marelli, Dalmine (IT); Peter Z. Onufryk, Flanders, NJ (US); Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 69 days.

(21) Appl. No.: 13/435,572

(22) Filed: Mar. 30, 2012

Related U.S. Application Data (60) Provisional application No. 61/585,627, filed on Jan. 11, 2012.

(51) Int. Cl.
*H03M 13/00* (2006.01)
(52) U.S. Cl.
USPC .......................................................... 714/755
(58) Field of Classification Search
None
See application file for complete search history.

(56) References Cited

U.S. PATENT DOCUMENTS

| | | | |
|---|---|---|---|
| 6,115,788 A | 9/2000 | Thowe | |
| 6,934,804 B2 | 8/2005 | Hashemi | |
| 6,976,194 B2 | 12/2005 | Cypher | |
| 8,255,770 B2 * | 8/2012 | Park et al. | 714/763 |
| 8,335,977 B2 * | 12/2012 | Weingarten et al. | 714/794 |
| 2003/0225970 A1 | 12/2003 | Hashemi | |
| 2004/0088636 A1 | 5/2004 | Cypher | |
| 2010/0199149 A1 * | 8/2010 | Weingarten et al. | 714/773 |
| 2011/0246853 A1 * | 10/2011 | Kim et al. | 714/758 |

\* cited by examiner

*Primary Examiner* — Guerrier Merant
(74) *Attorney, Agent, or Firm* — Kenneth Glass; Stanley J. Pawlik; Glass & Associates (57) ABSTRACT

A nonvolatile memory controller to recover encoded data by performing a hard-decision inner error correction code decoding and an outer error correction code decoding of the data decoded using the hard-decision inner error correction code decoding and then determining if the encoded data has been successfully decoded. If the encoded data has not been successfully decoded, the controller performs a soft-decision inner error correction code decoding of the encoded data using a soft-decision algorithm and an outer error correction code decoding of the data decoded using the soft-decision inner error correction code decoding and then determining if the encoded data has been successfully decoded. If the encoded data has not been successfully decoded, the controller recovers the data by performing a RAID operation on the encoded data.

23 Claims, 4 Drawing Sheets

NONVOLATILE MEMORY CONTROLLER WITH ERROR DETECTION FOR CONCATENATED ERROR CORRECTION CODES

CROSS-REFERENCES TO RELATED APPLICATIONS

This application claims benefit of U.S. Patent Application Ser. No. 61/585,627 filed on Jan. 11, 2012 and entitled "Error Correction Architecture for Reliable SSD" and is related to U.S. patent application Ser. No. 13/434,770 filed on Mar. 29, 2012 and titled "NONVOLATILE MEMORY CONTROLLER WITH CONCATENATED ERROR CORRECTION CODES," each of which is incorporated herein by reference in its entirety.

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of error bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory.

The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

One type of error correction coding often employed in a flash storage controller is a Bose-Chaudhuri-Hochquenghem (BCH) error correction. Typically, a target UBER for an SSD ranges between $10^{-15}$ and $10^{-16}$, and the BCH error correction capability is chosen based upon this target UBER. However, due to the increased RBER of the NAND-based flash memory technology, the BCH error correction currently employed in the art for the recovery of data errors in a NAND-based flash memory is impractical to meet the target UBER.

One of the key features of BCH error correction codes is that during code design, the designer has control over the number of symbol errors that may be correctable by the BCH decoder. As such, a BCH decoder can be designed that exhibits strong error detection and correction capabilities to meet the target UBER. However, there is an upper limit to the number of errors that are detectable and correctable by a BCH error correction code.

Another type of error correction coding that may be employed in a flash storage controller is a low-density parity-check (LDPC) error correction coding. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired. LDPC error correction is superior to BCH error correction, with LDPC codes being capable of producing a UBER that is very near the Shannon limit with a lower code rate than is required using BCH error correction. However, LDPC codes may exhibit an error floor that limits the performance of the LDPC error correction. While it is known that the UBER steadily decreases as the signal-to-noise ratio condition of the channel improves, for LDPC codes there exists a point after which the rate of decrease in the UBER flattens. This region is commonly referred to as the error floor region for LDPC error correction. To guarantee a target UBER of between $10^{-15}$ and $10^{-16}$ with LDPC error correction, it is necessary to know the value of the error floor. The error floor for LDPC cannot be mathematically determined and simulation is necessary to identify the value of the error floor. However, with modern technology, it is not possible to simulate up to $10^{-16}$ to identify the value of the error floor, and as such, a target UBER of $10^{-16}$ cannot be guaranteed with LDPC error correction.

Various methods for decoding data encoded with LDPC error correction codes are known in the art. Two general LDPC decoding methods known in the art are soft-decision decoding and hard-decision decoding. Soft-decision decoding algorithms, such as the sum-product algorithm (SPA) and min-sum algorithm (MSA) are iterative and are based on belief propagation. The sum-product algorithm is known to achieve the best decoding performance, but it is computationally complex. The computational complexity of the SPA necessitates a decoding device having a large number of logic gates, resulting in an increased cost and decreased power efficiency of the device. The min-sum algorithm (MSA) is less complex than the SPA, but exhibits a noticeable degradation in the decoding performance compared to SPA. Hard-decision decoding is a less complex decoding algorithm for LDPC codes, however, its simplicity results in a significant performance loss compared to soft-decision decoding solutions. Hard-decision decoding algorithms for LDPC codes known in the art include the bit-flipping (BF) algorithm. While soft-decision decoding typically outperforms hard-decision decoding, soft-decision decoding requires multiple reads from the flash storage, thereby greatly increasing the bandwidth necessary to perform the decoding of the LDPC encoded data.

Both hard-decision and soft-decision LDPC codes may suffer from poor detection capabilities. It follows that an LDPC decoder may conclude that the encoded data has been successfully decoded, when in reality, errors still exist in the data that need to be corrected to successfully decode the encoded data.

Additionally, the RBER of the flash memory device may increase as the flash memory ages. As the RBER increases over time, more correction of the encoded data is required.

Accordingly, what is needed in the art is an improved flash controller that is capable of meeting the target UBER for a nonvolatile memory storage system over the lifetime of the flash memory device.

SUMMARY

In various embodiments, a nonvolatile memory system includes a nonvolatile memory storage module for storing encoded data and a nonvolatile memory controller. The encoded data stored in the nonvolatile memory storage module is encoded using an outer error correction code concatenated with an inner error correction code. The nonvolatile memory controller receives the encoded data stored in the nonvolatile memory storage module and attempts to decode and recover the data. The nonvolatile memory controller may attempt to recover the encoded data by performing a hard-decision inner error correction code decoding of the encoded data using a hard-decision algorithm and by performing an outer error correction code decoding of the hard-decision inner error correction code decoded data. The nonvolatile memory controller may then determine if the encoded data was successfully decoded by the hard-decision inner error correction code decoding and the outer error correction code decoding. If the encoded data was not successfully decoded by the hard-decision inner error correction code decoding and the outer error correction code decoding, the nonvolatile memory controller may attempt to recover the encoded data by performing a soft-decision inner error correction code decoding of the encoded data using a soft-decision algorithm and by performing an outer error correction code decoding of the soft-decision inner error correction code decoded data. The nonvolatile memory controller may then determine if the encoded data was successfully decoded by the soft-decision inner error correction code decoding and the outer error correction code decoding. If the encoded data was not successfully decoded by the hard-decision inner error correction code decoding and the outer error correction code decoding and if the encoded data was not successfully decoded by the soft-decision inner error correction code decoding and the outer error correction code decoding, the nonvolatile memory may recover the data by performing a redundant array of independent disks (RAID) operation of the encoded data.

More specifically, the nonvolatile memory controller may include an error detection and correction module for recovering the data received from the nonvolatile memory storage module. The error detection and correction module may include an hard-decision inner error correction code decoder using a hard-decision algorithm for decoding the encoded data, a soft-decision inner error correction code decoder using a soft-decision algorithm for decoding the encoded data and an outer error correction code decoder coupled to the hard-decision inner error correction code decoder and the soft-decision inner error correction code decoder. The outer error correction code decoder may decode the data that has been decoded by the hard-decision inner error correction code decoder to determine if the encoded data has been successfully decoded by the hard-decision inner error correction code decoder. The outer error correction code decoder may also decode the data that has been decoded by the soft-decision error correction code decoder to determine if the encoded data has been successfully decoded by the soft-decision inner error correction code decoder. The nonvolatile memory controller may further include a redundant array of independent disks (RAID) control module coupled to the error detection and correction module.

In operation the error detection and correction module may recover the data by decoding the encoded data in the nonvolatile memory storage module using a hard-decision inner error correction code decoding and an outer error correction code decoding. If the outer error correction code decoder determines that the encoded data has not been successfully decoded by the hard-decision inner error correction code decoding and the outer error correction code decoding, the data may be decoded using a soft-decision inner error correction code decoding and the outer error correction code decoding. If the outer error correction code decoder determines that the encoded data has not been successfully decoded by the soft-decision inner error correction code decoding and the outer error correction code decoding, the data may be decoded using the RAID control module.

In a particular embodiment, the inner outer correction code may be a Bose-Chaudhuri-Hocquenghem (BCH) code.

In an additional embodiment, the inner error correction code may be a low-density parity-check (LDPC) code and in a specific embodiment, the inner error correction code may be a quasi-cyclic low-density parity-check (LDPC) code.

The nonvolatile memory storage module may be a NAND flash memory module and the nonvolatile memory system may be a solid state drive (SSD).

The system in accordance with the present invention allows a target uncorrectable bit error rate (UBER) to be reached for a nonvolatile memory storage system in which the data exhibits an increasing raw bit error rate (RBER) over the lifetime of the nonvolatile memory storage system.

In receiving the encoded data from the nonvolatile memory storage module, the nonvolatile memory controller may read the data and the outer error correction code encoding the data from a first flash page and may read the inner error correction code from a second flash page. The first flash page and the second flash page may be read a plurality of times for performing the soft-decision inner error correction code decoding.

Performing an outer error correction code decoding of the hard-decision inner error correction code decoded data and determining if the encoded data was successfully decoded by the hard-decision inner error correction code decoding and the outer error correction code decoding may further include, detecting a number of errors in the hard-decision inner error correction code decoded data and correcting the number of errors detected in the hard-decision inner error correction code decoded data if the number of errors does not exceed a correction capacity of the outer error correction code decoding and determining that the encoded data was not successfully decoded by the hard-decision inner error correction code decoding and the outer error correction code decoding if the number of errors detected in the hard-decision inner error correction code decoded data exceeds the correction capacity of the outer error correction code decoding.

Detecting a number of errors in the hard-decision inner error correction code decoded data may further include, calculating the syndromes of the hard-decision inner error correction code decoded data and determining that errors have been detected in the hard-decision inner error correction code decoded data if at least one syndrome is non-zero.

Performing an outer error correction code decoding of the soft-decision inner error correction code decoded data and determining if the encoded data was successfully decoded by the soft-decision inner error correction code decoding and the outer error correction code decoding may further include, detecting a number of errors in the soft-decision inner error correction code decoded data, correcting the number of errors detected in soft-decision inner error correction code decoded data if the number of errors does not exceed a correction capacity of the outer error correction code decoding and determining that the encoded data was not successfully decoded by the soft-decision inner error correction code decoding and the outer error correction code decoding if the number of errors detected in the soft-decision inner error correction code decoded data exceeds the correction capacity of the outer error correction code decoding.

Detecting a number of errors in the soft-decision inner error correction code decoded data may further include, calculating the syndromes of the soft-decision inner error correction code decoded data and determining that errors have been detected in the soft-decision inner error correction code decoded data if at least one syndrome is non-zero.

The RBER will increase with the age of the flash memory. With the present invention, when the device ages and the data recovery begins to fail while using the hard-decision inner error correction code decoder having a hard-decision algorithm, because too many errors remain in the data (high RBER) to reliably recover the data using the outer error correction code, a soft-decision inner error correction code decoder having a soft-decision algorithm in combination with the outer error correction code decoder may be used to decode the encoded data and to improve the reliability of the nonvolatile memory system. As the flash device continues to age, if the decoding fails while employing the hard-decision inner error correction decoding and the soft-decision inner error correction code decoding in combination with the outer error correction code decoding, the encoded data may then be recovered by employing a RAID module.

The method of the present invention improves the reliability of the nonvolatile memory storage system by enabling a target uncorrectable bit error rate (UBER) to be reached over the lifetime of the nonvolatile memory storage system.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In various embodiments, a nonvolatile memory system includes a nonvolatile memory storage module for storing encoded data and a nonvolatile memory controller. The encoded data stored in the nonvolatile memory storage module is encoded using an outer error correction code concatenated with an inner error correction code. The nonvolatile memory controller receives the encoded data stored in the nonvolatile memory storage module and attempts to decode and recover the data. The nonvolatile memory controller may recover the encoded data by performing a hard-decision inner error correction code decoding of the encoded data using a hard-decision algorithm and by performing an outer error correction code decoding of the hard-decision inner error correction code decoded data. The nonvolatile memory controller may then determine if the encoded data was successfully decoded by the hard-decision inner error correction code decoding and the outer error correction code decoding. If the encoded data was not successfully decoded by the hard-decision inner error correction code decoding and the outer error correction code decoding, the nonvolatile memory controller may recover the encoded data by performing a soft-decision inner error correction code decoding of the encoded data using a soft-decision algorithm and by performing an outer error correction code decoding of the soft-decision inner error correction code decoded data. The nonvolatile memory controller may then determine if the encoded data was successfully decoded by the soft-decision inner error correction code decoding and the outer error correction code decoding. If the encoded data was not successfully decoded by the hard-decision inner error correction code decoding and the outer error correction code decoding and if the encoded data was not successfully decoded by the soft-decision inner error correction code decoding and the outer error correction code decoding, the nonvolatile memory may recover the data by performing a redundant array of independent disks (RAID) operation of the encoded data.

Figure 1:
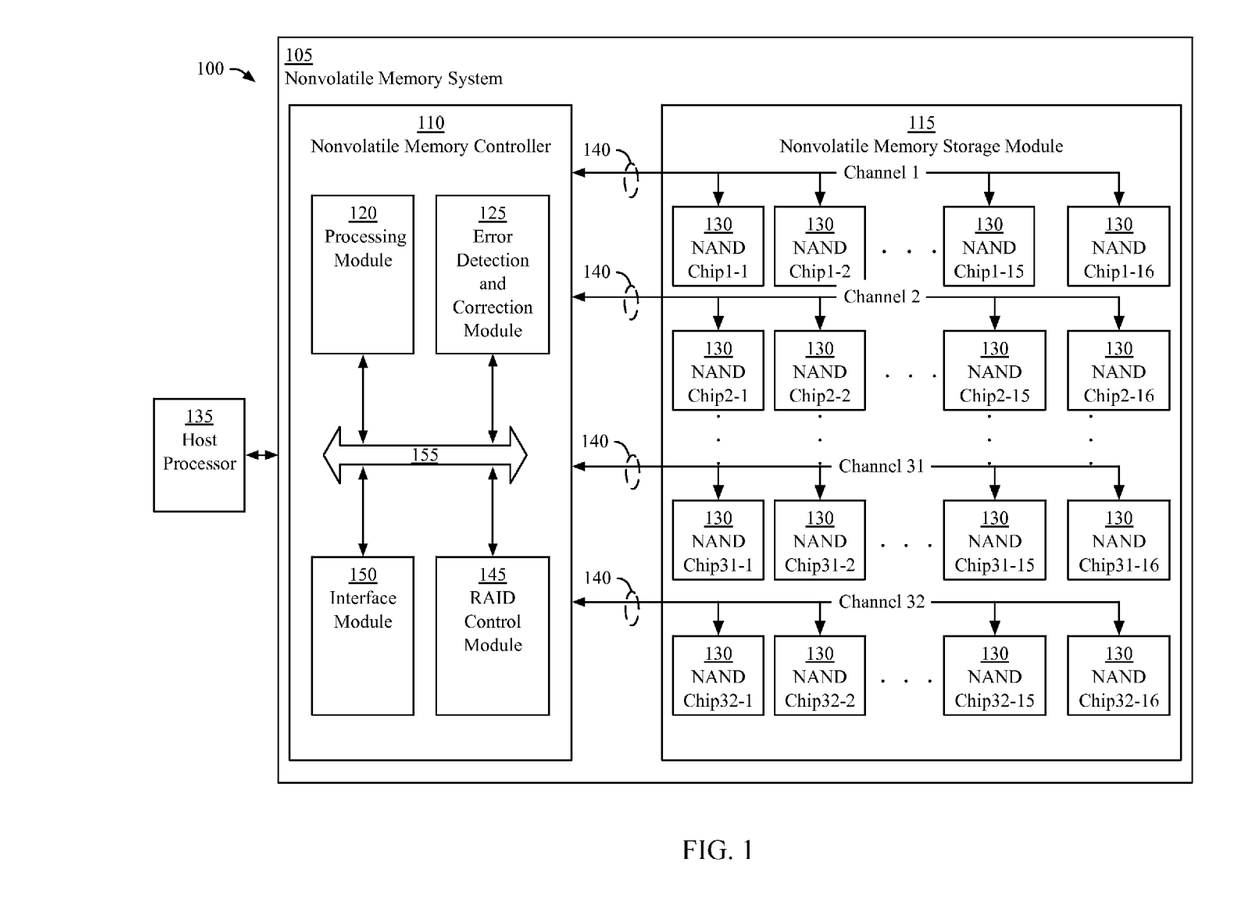
FIG. 1 is a block diagram of a computing system including a nonvolatile memory controller, in accordance with an embodiment of the present invention.

FIG. 1 illustrates a computing system 100, in accordance with an embodiment of the present invention. The computing system 100 includes a host processor 135 and a nonvolatile memory system 105 coupled to the host processor 135. The nonvolatile memory system 105 includes a nonvolatile memory controller 110 and a nonvolatile memory storage module 115 coupled to the nonvolatile memory controller 110. The nonvolatile memory system 105 may be a solid stated drive (SSD).

The nonvolatile memory controller 110 may include a processing module 120, an error correction and detection module 125, an interface module 150 and a redundant array of independent disks (RAID) control module 145. The processing module 120 may be coupled to the error correction and detection module 125, the interface module 150 and the RAID control module 145 through a communication bus 155, as is commonly know in the art. The error correction and detection module 125 may be coupled to the communication bus 155 and to the nonvolatile memory storage module through a plurality of corresponding data channels 140. The RAID control module 145 may be coupled to the nonvolatile memory storage module through the corresponding data channels 140 and to the communication bus 155.

The nonvolatile memory storage module 115 may include a plurality of nonvolatile memory storage chips 130 comprising a plurality of memory storage cells. The memory storage chips 130 may be organized in pages, each comprising a plurality of memory storage cells. In a particular embodiment, the nonvolatile memory storage module 115 may be based on NAND technology and may include 512 NAND memory storage chips 130 to provide a total storage capacity of 1 TBytes. A 32-data channel 140 configuration may be implemented to operate the 512 NAND memory storage chips 130 of the nonvolatile memory storage module 115 with the nonvolatile memory storage controller 110 using 16 independent channels.

In operation, the interface module 150 may receive one or more data write commands, and associated data, from the host processor 135. The interface module 150 may then communicate the data write commands to the error detection and correction module 125. The error detection and correction module 125 may encode the data prior to writing the data to the nonvolatile memory storage module. The data may be encoded using an outer error correction code concatenated with an inner error correction code.

After the data has been encoded and written to the nonvolatile memory storage module 115, the interface module 150 may receive one or more data read commands from the host processor 135. The interface module 150 may then communicate the data read commands to the processing module 120 to instruct the error detection and correction module 125 to read the encoded data from the nonvolatile memory storage module 115 over one of the communication channels 140. The error detection and correction module 125 may then attempt to recover the data from the encoded data using the inner error correction code of the encoded data with a hard-decision algorithm followed by using the outer error correction code to decode the data. In performing error detection, the error detection and correction module 125 may detect errors in the encoded data. In performing error correction, the error detection and correction module 125 may detect errors in the encoded data and correct the errors to recover the encoded data. If the data recovery is successful, the data may be recovered and the error detection and correction module 125 may communicate the data recovery to the processing module 120. If the data recovery fails using the inner error correction code with a hard-decision algorithm followed by using the outer error correction code to decode the data, the error correction and detection module 125 may attempt to recover the data from the encoded data using the inner error correction code with a soft-decision algorithm followed by using the outer error correction code to decode the data. If the data recovery is successful using the inner error correction code with a soft-decision algorithm followed by the outer error correction code, the data may be recovered and the error detection and correction module 125 may communicate the data recovery to the processing module 120. If the data recovery fails when using the inner error correction with a soft-decision algorithm followed by the outer error correction code, the error correction and detection module 125 may communicate the failure to the processing module 120 and the processing module 120 may instruct the RAID control module 145 to access the nonvolatile memory storage module 115 to recover the data from the encoded data stored in the nonvolatile memory storage module 115.

In various embodiments, each of the processing module 120, the error detection and correction module 125, the interface module 150, the RAID control module 145 and the nonvolatile memory storage module 115 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like.

In various embodiments, the nonvolatile memory system 105 is implemented in an integrated circuit of an integrated circuit device, which may include an integrated circuit package containing the integrated circuit. In some embodiments, the nonvolatile memory system 105 is implemented in a single integrated circuit die. In other embodiments, the nonvolatile memory system 105 is implemented in more than one integrated circuit die of an integrated circuit device which may include a multichip package containing the integrated circuit die.

In various embodiments, the nonvolatile memory controller 110 is implemented in an integrated circuit of an integrated circuit device, which may include an integrated circuit package containing the integrated circuit. In some embodiments, the nonvolatile memory controller 110 is implemented in a single integrated circuit die. In other embodiments, the nonvolatile memory controller 110 is implemented in more than one integrated circuit die of an integrated circuit device which may include a multichip package containing the integrated circuit die.

In various embodiments, the nonvolatile memory storage module 115 is implemented in an integrated circuit of an integrated circuit device, which may include an integrated circuit package containing the integrated circuit. In some embodiments, nonvolatile memory storage module 115 is implemented in a single integrated circuit die. In other embodiments, nonvolatile memory storage module 115 is implemented in more than one integrated circuit die of an integrated circuit device which may include a multichip package containing the integrated circuit die.

Figure 2:
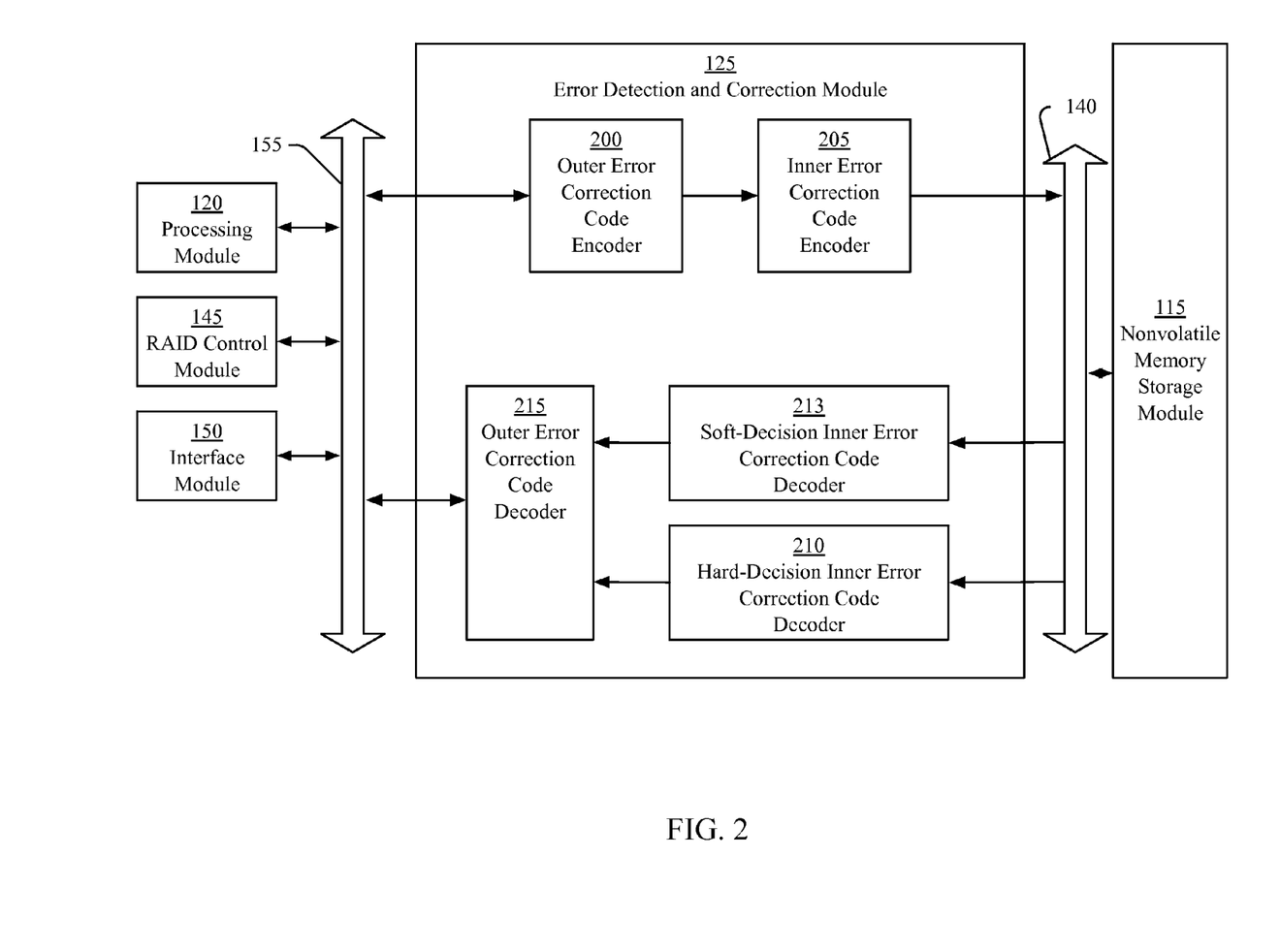
FIG. 2 is a block diagram of an error detection and correction module, in accordance with an embodiment of the present invention.

FIG. 2 illustrates the error detection and correction module 125, in accordance with an embodiment of the present invention. The processing module 120, the RAID control module 145 and the interface module 150 may be coupled together though a communication bus 155. The error detection and correction module 125 may be coupled to the processing module 120, the RAID control module 145 and the interface module 150 through the communication bus 155. The error detection and correction module 125 may be coupled to the nonvolatile memory storage module 115 through the communication bus 140.

The error detection and correction module 125 may include an outer error correction code encoder 200, an inner error correction code encoder 205, a hard-decision inner error correction code decoder employing a hard-decision decoding algorithm 210, a soft-decision inner error correction code decoder employing a soft-decision decoding algorithm 213 and an outer error correction code decoder 215. The terms "inner" and "outer" may reference the physical location and/or logical location of the encoders and decoders within the error detection and correction module relative to the nonvolatile memory storage module. The outer error correction code encoder 200 may be coupled to the processing module 120, the interface module 150 through the communication bus 155. The inner error correction code encoder 205 may be coupled to the outer error correction code encoder 200 and to the nonvolatile memory storage module 115 through the communication bus 140. The outer error correction code decoder 215 may be coupled to the nonvolatile memory storage module 115 through the communication bus 140. The hard-decision inner error correction code decoder 210 may be coupled to the nonvolatile memory storage module 115 through the communication bus 140 and to the outer error correction code decoder 215. The soft-decision inner error correction code decoder 213 may be coupled to the nonvolatile memory storage module 115 through the communication bus 140 and to the outer error correction code decoder 215. The outer error correction code decoder 215 may be coupled to the processing module 120, the RAID control module 145 and the interface module 150 through the communication channel 155.

In operation, the interface module 150 may receive one or more data write commands, and associated data, from the host processor 135. The interface module 150 may then communicate the data write commands to the error detection and correction module 125 and to the processing module 120 through the communication bus 155. The outer error correction code encoder 200 of the error detection and correction module 125 may encode the data with an outer error correction code. The outer error correction code encoder 200 may encode the data by adding redundant data, or parity bits, to the data, such that the data can be recovered from the nonvolatile memory storage module 115 when errors are subsequently introduced into the data by the nonvolatile memory storage module 115. Various mechanisms may lead to bit errors in flash memories, including noise at the power rails, voltage threshold disturbances during the reading and/or writing of neighboring cells, retention loss due to leakage within in the cells and tunneling. By encoding the data with an outer error correction concatenated with an inner error correction code, the error detection and correction module may subsequently read the encoded data from the nonvolatile memory storage module 115, and the redundant data bits added to the data may allow the error detection and correction module 125 to determine whether or not the data stored in the nonvolatile memory storage module 115 has been corrupted during the storage of the data, and if so, the error detection and correction module 125 may identify the specific data bits that have been corrupted and correct the data. As such, prior to writing the data to the nonvolatile memory storage module 115, the outer error correction code encoder 200 may add a number of parity bits to the data. After the outer error correction code encoder 200 has added the parity bits to the data using the outer error correction code, the inner error correction code encoder 205 may add additional parity bits to the data using an inner error correction code. The inner error correction code may be a different error correction code than the outer error correction code. The outer error correction code may exhibit an error floor. In accordance with an embodiment of the present invention, the data may be encoded using an outer error correction code concatenated with an inner error correction code, wherein the outer error correction code applied to the data by the outer error correction code encoder 200 is concatenated with the inner error correction code applied to the data by the inner error correction code encoder 205. The data comprising the outer error correction code concatenated with the inner error correction code may then be written to the nonvolatile memory storage module 115.

In a particular embodiment the hard-decision inner error correction code decoder 210 and the soft-decision inner error correction code decoder 213 may be the same decoder capable of running both a hard-decision and a soft-decision algorithm as necessary to successfully decode the encoded data. Alternatively, the hard-decision inner error correction code decoder 210 and the soft-decision inner error correction code decoder 213 may be different decoders. In a specific embodiment, the hard-decision inner error correction code decoder 210 may be a bit-flipping LDPC decoder or a Gallager LDPC decoder. In an additional embodiment, the soft-decision inner error correction code decoder 213 may be based on a sum-product algorithm (SPA) or min-sum algorithm (MSA).

In an exemplary encoding of the data using the concatenated outer error correction and inner error correction code, the inner error correction code parity bits are not included in the outer error correction code parity. Separating the parity of the inner error correction code from the parity of the outer error correction code allows the inner error correction code to be stored in a different flash page than the outer error correction code and the data. The inner error correction code in a specific implementation may have a stronger error correction code than the outer error correction code. The stronger inner error correction code may result in a lower UBER at select RBERs. In addition, the stronger inner error correction code may result in an increased code rate for the inner error correction requiring a larger number of parity bits for encoding. Due to the increased number of parity bits in the stronger inner error correction code, the number of parity bits required for the inner error correction code rate may be such that the data and the inner error correction code are unable to fit on the same flash page and it may be necessary to store the inner error correction code in a different flash page than the data. In contrast, the outer error correction code may be a weaker error correction code requiring fewer parity bits for encoding. As such, the outer error correction code may be able to fit on the same flash page as the data.

After the data has been encoded and written to the nonvolatile memory storage module 115, the interface module 150 may receive one or more data read commands from the host processor 135. The interface module 150 may then communicate the data read commands to the processing module 120 to instruct the error detection and correction module 125 to read the encoded data from the nonvolatile memory storage module 115 over one of the communication channels 140. In reading the encoded data from the nonvolatile memory storage module 125, if the outer error correction code and the data encoded by the outer error correction code are stored on the same flash page, it may only be necessary for the error detection and correction module 125 to read the flash page that contains both the outer error correction code and the data.

The encoded data read from the nonvolatile memory storage module 115 may be received by the hard-decision inner error correction code decoder 210. The hard-decision inner error correction code decoder 210 may then attempt to recover the data from the encoded data by performing a hard-decision inner error correction code decoding of the encoded data using a hard-decision algorithm. The outer error correction code decoder 215 may then perform an outer error correction code decoding of the hard-decision inner error correction code decoded data to determine if the encoded data was successfully decoded by the hard-decision inner error correction code decoding and the outer error correction code decoding. In performing the outer correction code decoding of the hard-decision inner error correction code decoded data, the outer error correction code decoder 215 may detect a number of errors in the hard-decision inner error correction code decoded data and correct the errors detected in the hard-decision inner error correction code decoded data if the number of errors detected does not exceed a correction capacity of the outer error correction code decoder 215. The correction capacity of the outer error correction code decoder 215 will be exceeded if the number of errors remaining in the hard-decision inner error correction code decoded data is greater than the number of bits that the outer error correction code decoder 215 is capable of correcting. If there are decoding errors in the hard-decision inner error correction code decoded data and the correction capacity of the outer error correction code is not exceeded, the outer error correction code decoder 215 may correct the errors identified in the data. The corrected data may then be provided to the communication channel 155. If the outer error correction code decoder 215 does not identify any errors in the decoded data, the decoded data may be provided to the communication channel 155 without being further corrected by the outer error correction code decoder 215.

If the correction capacity of the outer error correction code decoder 215 is exceeded after the hard-decision inner error correction code decoding of the encoded data by the hard-decision inner error correction code decoder 210, the error correction and detection module 125 may attempt to recover the data from the encoded data by performing a soft-decision inner error correction code decoding of the encoded data using the soft-decision inner error correction code decoder 213. The outer error correction code decoder 215 may then perform an outer error correction code decoding of the soft-decision inner error correction code decoded data to determine if the encoded data was successfully decoded by the soft-decision inner error correction code decoding and the outer error correction code decoding. In performing the outer correction code decoding of the soft-decision inner error correction code decoded data, the outer error correction code decoder 215 may detect a number of errors in the soft-decision inner error correction code decoded data and correct the errors detected in the soft-decision inner error correction code decoded data if the number of errors detected does not exceed a correction capacity of the outer error correction code decoder 215. The correction capacity of the outer error correction code decoder 215 will be exceeded if the number of errors remaining in the soft-decision inner error correction code decoded data is greater than the number of bits that the outer error correction code decoder 215 is capable of correcting. If there are decoding errors in the soft-decision inner error correction code decoded data and the correction capacity of the outer error correction code is not exceeded, the outer error correction code decoder 215 may correct the errors identified in the data. The corrected data may then be provided to the communication channel 155. If the outer error correction code decoder 215 does not identify any errors in the decoded data, the decoded data may be provided to the communication channel 155 without being further corrected by the outer error correction code decoder 215.

In performing the soft-decision inner error correction code decoding of the encoded data, it may be necessary for the error detection and correction module 125 to make multiple reads of the encoded data from the nonvolatile memory storage module 115 over one of the communication channels 140. Soft-decision decoding requires multiple reads from the nonvolatile memory storage module 115 to detect soft information about the threshold voltage of the encoded data. In a specific embodiment, the number of reads may be incremental, beginning with two bits of soft information, requiring three data reads of the encoded data, and increase to three bits of soft information, may require seven reads of the encoded data, if the decoding is unsuccessful with two bits of soft information. If the decoding continues to be unsuccessful, the number of reads may continue to incrementally increase up to the maximum of N bits. The number of reads performed by the error detection and correction module 125 will be used to perform the soft-decision error correction code decoding with the soft-decision error correction code decoder 213.

If the correction capacity of the outer error correction code decoder 215 is exceeded when the data corrected by the soft-decision error correction code decoder 213 is decoded by the outer error correction code decoder 215, the error detection module 220 may communicate to the processing module that the error detection and correction module 125 is unable to recover the data. The error detection module 220 may communicate the failure to the processing module 120 and the processing module 120 may instruct the RAID control module 145 to access the nonvolatile memory storage module 115 to recover the data from the encoded data stored in the nonvolatile memory storage module 115.

In various embodiments, each of the outer error correction code encoder 200, the inner error correction code encoder 205, the outer error correction code decoder 215, hard-decision inner error correction code decoder 210 and the soft-decision inner error correction code decoder 213 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like.

In various embodiments, the outer inner correction code may be a low-density parity check (LDPC) error correction code and the outer error correction code may be a Bose-Chaudhuri-Hochquenghem (BCH) error correction code.

The LDPC code may selected from one of a variety of error correction codes associated with LDPC codes, including regular or irregular LDPC codes, quasi-cyclic LDPC codes, irregular repeat accumulate (IRA) codes, codes based on projective geometry or any of a variety of error correction codes associated with LDPC as are known in the art. The LDPC correction code may be known to exhibit an error floor.

In various embodiments, the BCH error correction code may have a very high error correction capacity. For example, the BCH correction code may have an uncorrected bit error rate (UBER) of $1 \times 10^{-9}$ for a raw bit error rate (BER) of $1 \times 10^{-3}$. As another example, the BCH error correction code may have an uncorrected bit error rate (UBER) of $1 \times 10^{-12}$ for a raw bit error rate (BER) of $1 \times 10^{-3}$. In some embodiments, the BCH error correction code may have an uncorrected bit error rate (UBER) in the range of $1 \times 10^{-9}$ to $1 \times 10^{-15}$ for a raw bit error rate (BER) of $1 \times 10^{-3}$.

Figure 3:
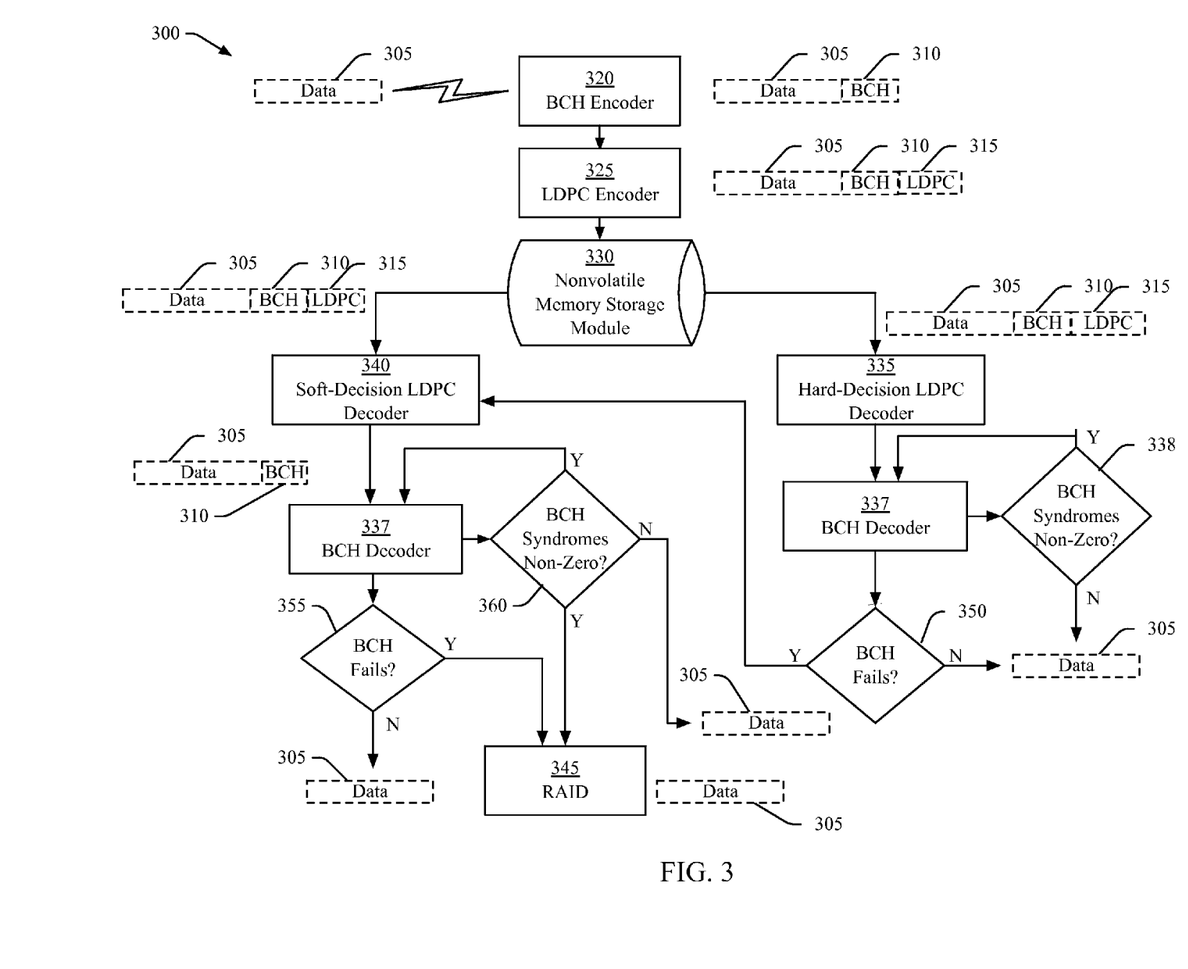
FIG. 3 is a diagram illustrating the flow of encoded data having an inner LDPC code concatenated with an outer BCH code, in accordance with an embodiment of the present invention

FIG. 3 is a diagram illustrating the flow of encoded data having an outer BCH code concatenated with an inner LDPC code, in accordance with an embodiment of the present invention. In the nonvolatile memory system 300 illustrated with reference to FIG. 3, upon the receipt of a write request, data 305 is received at a BCH encoder 320. The BCH encoder encodes the received data 305 by adding redundant bits 310 to the data 305. The number of bits added to the data is dependent upon the BCH code being used. The data 305 and the BCH code 310 are then communicated to the LDPC encoder 325. The LDPC encoder 325 encodes the data 305 by adding redundant bits 315 to the data 305. In this way, the data is encoded using a concatenated code including an LDPC code 310 and a BCH code 325 by adding the LDPC code 310 and the BCH code 325 to the data 305 to form the encoded data. Depending upon the strength of the BCH code 325, it may be necessary to store the data 305 and the BCH code 310 in a first flash page and to store the LDPC code 325 in a second flash page. Alternatively, the data 305 and the LDPC code 325 may be stored in a first flash page and the BCH code 310 may be stored in a second flash page. Additionally, the data 305, the LDPC code 310 and the BCH code 315 may be stored in the same flash page. The encoded data comprising the data 305 and the concatenated error codes 310, 315 are then communicated to the nonvolatile memory storage module 330. The encoded data is stored in the nonvolatile memory storage module 330 until the nonvolatile memory system 300 receives a read request.

Upon receiving a read request at the nonvolatile memory system 300, the nonvolatile memory system 300 reads the encoded data from the nonvolatile memory storage module 330 and communicates the encoded data, including the data 305 and the LDPC code 310, to the hard-decision LDPC decoder 335. If the data 305 and the LDPC code 310 are stored in the same flash page, it may only be necessary to read one flash page from the nonvolatile memory storage module 330. The hard-decision LDPC decoder 335 will attempt to recover the data 305 from the encoded data using the LDPC code 310 and a hard-decision algorithm. The hard-decision LDPC decoder 335 recovers the data 305 from the encoded data by identifying any errors in the data using the LDPC code 310 and correcting any identified errors. Because LDPC decoding suffers from poor detection capabilities, after the encoded data has been decoded using the hard-decision LDPC decoder 335, the decoded data needs to be checked to see if any errors remain in the decoded data. The BCH decoder 337 may be used to check the hard-decision decoded data for errors after the hard-decision LDPC decoding 335 has been performed. In checking for errors, the BCH decoder 337 may perform a full decode of the hard-decision decoded data. Alternatively, the BCH decoder 337 may perform a syndrome check 338 to determine if any errors remain in the hard-decision decoded data. If the syndrome check 338 does not produce a non-zero result, then it may be determined that the encoded data has been successfully decoded by the hard-decision LDPC decoder 335. If the syndrome check 338 produces a non-zero result, then it may be determined that the encoded data has not been successfully decoded by the hard-decision LDPC decoder 335 and the hard-decision decoded data requires additional decoding. If the syndrome check 338 has been used, the hard-decision decoded data may then be decoded by the BCH decoder 337 to identify the errors remaining in the hard-decision decoded data. The BCH decoder 337 may then be used to correct the errors identified in the hard-decision decoded data. However, the BCH decoder 337 is only able to correct the number of errors up to the correction capacity of the BCH code 315. If the error correction capacity of the BCH decoder 337 is not exceeded, the BCH decoder 337 will be successful and the BCH decoder 337 will be able to recover the data 305 from the encoded data. If the error correction capacity of the BCH decoder 337 is exceeded and the BCH decoder 337 is unable to recover the data from the encoded data, the BCH decoder 337 recovery will fail 350 and the recovery of the data will be unsuccessful.

If recovery of the data 305 using the hard-decision LDPC decoder 335 and the BCH code 337 fails, the nonvolatile memory system 300 communicates the encoded data, including the data 305, the LDPC code 310 and the BCH code 315, to the soft-decision LDPC decoder 340. If the data 305 and the LDPC code 310 are stored in the same flash page, but the BCH code 315 is stored in a different flash page, it may be necessary to read a first flash page containing the data 305 and the LDPC code 310 and to read a second flash page containing the BCH code 315 from the nonvolatile memory storage module 330. Alternatively, the data 305, the LDPC code 310 and the BCH code 315 may be stored in the same flash page. To perform a soft-decision LDPC decoding of the data, it may be necessary to read the first flash page and the second flash page multiple times. The soft-decision LDPC decoder 340 will recover the data 305 from the encoded data using the LDPC code 315. The soft-decision LDPC decoder 340 recovers the data 305 from the encoded data by identifying any errors in the data using the LDPC code 310 and correcting any identified errors. After the data 305 has been decoded and corrected by the soft-decision LDPC decoder 340, the data 305 and the BCH code 315 are communicated to the BCH decoder 337. Because LDPC decoding suffers from poor detection capabilities, after the encoded data has been decoded using the soft-decision LDPC decoder 340, the decoded data needs to be checked to see if any errors remain in the decoded data. The BCH decoder 337 may be used to check the soft-decision decoded data for errors after the soft-decision LDPC decoding 340 has been performed. In checking for errors, the BCH decoder 337 may perform a full decode of the hard-decision decoded data. Alternatively, the BCH decoder 337 may perform a syndrome check 360 to determine if any errors remain in the soft-decision decoded data. If the syndrome check 360 does not produce a non-zero result, then it may be determined that the encoded data has been successfully decoded by the soft-decision LDPC decoder 340. If the syndrome check 360 produces a non-zero result, then it may be determined that the encoded data has not been successfully decoded by the soft-decision LDPC decoder 340 and the soft-decision decoded data requires additional decoding. If the syndrome check 360 has been used, the soft-decision decoded data may then be decoded by the BCH decoder 337 to identify the errors remaining in the soft-decision decoded data. The BCH decoder 337 may then be used to correct the errors identified in the soft-decision decoded data. The BCH decoder 337 will attempt to recover the data 305 from the encoded data corrected by the soft-decision LDPC decoder 340 using the BCH code 315. The BCH decoder 337 recovers the data 305 from the soft-decision decoded data by identifying any remaining errors in the soft-decision decoded data using the BCH code 315 and correcting any identified errors. However, the BCH decoder 337 is only able to correct the number of errors up to the correction capacity of the BCH code 315. If the error correction capacity of the BCH decoder 337 is not exceeded, the BCH decoder 337 will be successful and the BCH decoder 337 will be able to recover the data 305 from the data corrected by the soft-decision LDPC decoder 340. If the error correction capacity of the BCH decoder 337 is exceeded and the BCH decoder 337 is unable to recover the data from data corrected by the soft-decision LDPC decoder 340, the BCH decoder 335 recovery will fail 337 and the decoding of the encoded data will be unsuccessful.

If the nonvolatile memory system fails to recover the data 305 from the encoded data using the soft-decision LDPC decoder 340 followed by the BCH decoder 337, the nonvolatile memory system will communicate the read request to a redundant array of independent disks (RAID) module 345 to recover the data 305. A RAID algorithm may be performed by the RAID control module 345 on a standard RAID level (e.g., a RAID level 3-6), as is known in the relevant art.

Figure 4:
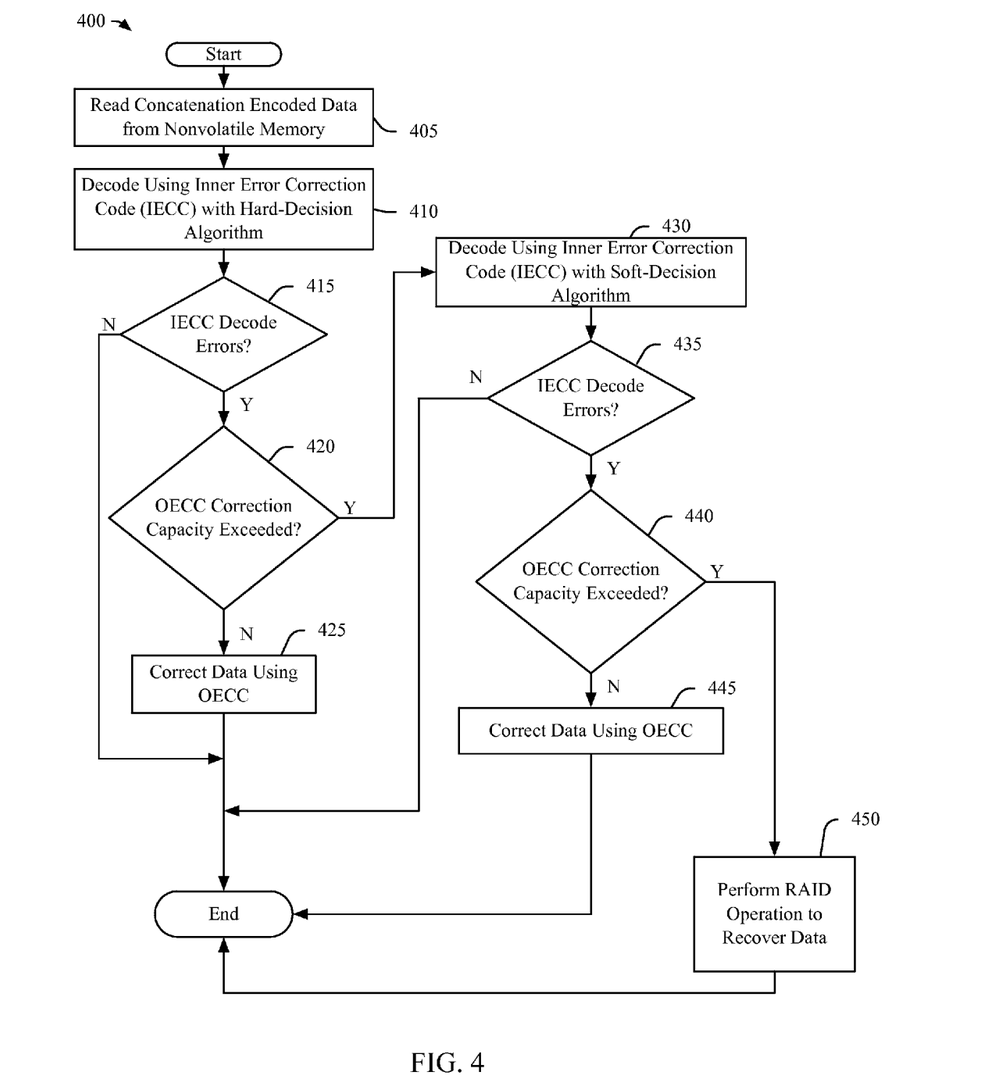
FIG. 4 is a flow diagram of a method of recovering encoded data, in accordance with an embodiment of the present invention.

FIG. 4 illustrates a flow diagram 400 for a method of recovering encoded data in a nonvolatile memory controller in accordance with an embodiment of the present invention. In accordance with various embodiments, upon receiving a read request for data stored in a nonvolatile memory storage module, the nonvolatile memory controller initiates a request to read the concatenation encoded data stored in the nonvolatile memory storage module 405. The concatenation encoded data stored in the nonvolatile memory storage module may include data having an outer error correction code concatenated with an inner error correction code. The outer error correction code and the inner error correction code may be stored in the same flash page as the data. Alternately, the outer error correction code and the data may be stored in a first flash page and the inner error correction code may be stored in a second flash page. The concatenation encoded data stored in the nonvolatile memory storage module may include a BCH code as an outer error correction code and an LDPC code as an inner error correction code.

After the concatenation encoded data is read from the nonvolatile memory storage module 405, the nonvolatile memory controller may recover the data from the concatenation encoded data by decoding the concatenation encoded data using the inner error correction code with a hard-decision algorithm 410. To recover the data from the concatenation encoded data, the nonvolatile memory storage module may decode the data using the inner error correction code with a hard-decision algorithm and then determine if there are any errors resulting from the decoding of the concatenation encoded data using the hard-decision inner error correction code 415. The outer error correction code decoder may be used to determine if any errors remain in the decoded data.

If there aren't any decoding errors resulting from decoding the concatenation encoded data using the hard-decision inner error correction code 415, the data may be recovered without being corrected by the outer error correction code and the nonvolatile memory controller may transfer the recovered data to a host processor.

If there are decoding errors resulting from decoding the concatenation encoded data using the hard-decision inner error correction code 415, the nonvolatile memory storage controller may then determine if the number of errors resulting from decoding the concatenation encoded data using the hard-decision inner error correction code exceeds the correction capacity of the outer error correction code 420. In various embodiments, the correction capacity of the outer error correction code may be exceeded if the number of errors resulting from the decoding of the concatenation encoded data using the hard-decision inner error correction code is greater than the number of errors correctable by the outer error correction code.

If the number of errors resulting from decoding the concatenation encoded data using the inner error correction code does not exceed the correction capacity of the outer error correction code, the data errors may be corrected using the outer error correction code 425 to successfully recover the data from the concatenated encoded data and the nonvolatile memory controller may transfer the recovered data to a host processor.

If the number of errors resulting from decoding the concatenation encoded data using the inner error correction code exceeds the correction capacity of the outer error correction code, then there are too many data errors for the outer error correction code to correct and the data may not be successfully recovered from the concatenation encoded data using only the hard-decision inner error correction code. When the outer error correction code is unable to successfully recover the data from the concatenation encoded data using the outer error correction code, the nonvolatile memory controller may attempt to recover the data from the concatenated encoded data using an inner error correction code with a soft-decision algorithm in combination with the outer error correction code.

To recover the data from the concatenation encoded data, the nonvolatile memory storage module may decode the data using the inner error correction code with a soft-decision algorithm 430 and then determine if there are any errors resulting from the decoding of the concatenation encoded data using the inner error correction code 435. The outer error correction code decoder may be used to determine if any errors remain in the decoded data.

If there aren't any decoding errors resulting from decoding the concatenation encoded data using the outer error correction code 435, the data may be recovered without being corrected by the outer error correction code and the nonvolatile memory controller may transfer the recovered data to a host processor.

If there are decoding errors resulting from decoding the concatenation encoded data using the soft-decision inner error correction code 430, the nonvolatile memory storage controller may then determine if the number of errors resulting from decoding the concatenation encoded data using the soft-decision inner error correction code exceeds the correction capacity of the outer error correction code 440. In various embodiments, the correction capacity of the outer error correction code may be exceeded if the number of errors resulting from the decoding of the concatenation encoded data using the soft-decision inner error correction code is greater than the number of errors correctable by the outer error correction code.

If the number of errors resulting from decoding the concatenation encoded data using the soft-decision inner error correction code does not exceed the correction capacity of the outer error correction code, the data errors may be corrected using the outer error correction code 445 to successfully recover the data from the concatenated encoded data and the nonvolatile memory controller may transfer the recovered data to a host processor.

If the number of errors resulting from decoding the concatenation encoded data using the soft-decision inner error correction code exceeds the correction capacity of the outer error correction code, then there are too many data errors for the outer error correction code to correct and the data may not be successfully recovered from the concatenation encoded data using only the soft-decision inner error correction code. When the outer error correction code is unable to successfully recover the data from the concatenation encoded data using the outer error correction code, the nonvolatile memory controller may attempt to recover the data from the concatenated encoded data using a redundant array of independent disks (RAID) operation 450 may be performed to recover the data.

With the present invention, if data recovery fails using the hard-decision inner error correction code because too many errors exist in the data (high RBER) to reliably recover the data using the outer error correction code and to meet a target UBER, the soft-decision inner error correction code in combination with the outer error correction code may be used to improve the reliability of the nonvolatile memory system. While the inner error correction code may exhibit an error floor and have poor detection capabilities, the outer error correction code may be used to correct the data, thereby improving the reliability of the memory system through the life cycle.

The method of the present invention allows a target uncorrectable bit error rate (UBER) to be reached for a nonvolatile memory storage system in which the data exhibits a high raw bit error rate (RBER) in the range of an error floor in the correction code.

In the present invention, the hard-decision LDPC decoder and the BCH decoder are in the data path to guarantee the required bandwidth, especially when the flash memory is new and the RBER is not very high. As the flash memory ages and the RBER increases, more correction will be required. As more correction is required, the hard-decision LDPC decoding in combination with the BCH decoding will be unsuccessful and it will become necessary to correct the data using the soft-decision LDPC decoding in combination with BCH decoding. Eventually, the RBER will increase to the point where the soft-decision LDPC decoding in combination with the BCH decoding will no longer be successful and RAID may then be used to recover the encoded data towards the end of the device life. In employing RAID to recover the encoded data, the soft-decision LDPC decoding may be performed first to decode the encoded data and to reach a target UBER, followed by RAID to complete the decoding of encoded data.

During the life of the nonvolatile memory storage system, the error rate of the nonvolatile storage system typically increases. With the present invention, the soft-decision LDPC decoder is only used when the error rates are so high that they exceed the correctability of the hard-decision LDPC decoder, which typically begins to occur toward the end of life of the device. As such, in the present invention, for the majority of the device life the soft-decision LDPC decoder may be removed from the main data path, resulting in the ability to design a smaller, lower bandwidth, and lower power LDPC decoder.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for recovering data stored in a nonvolatile memory storage module, the method comprising:
   receiving encoded data from a nonvolatile memory storage module at a nonvolatile memory controller, the encoded data comprising an outer error correction code concatenated with an inner error correction code;
   performing a hard-decision inner error correction code decoding of the encoded data using a hard-decision algorithm and performing an outer error correction code decoding of the hard-decision inner error correction code decoded data and determining if the encoded data was successfully decoded by the hard-decision inner error correction code decoding and the outer error correction code decoding;
   if it is determined that the encoded data was not successfully decoded by the hard-decision inner error correction code decoding and the outer error correction code decoding, performing a soft-decision inner error correction code decoding of the encoded data using a soft-decision algorithm and performing an outer error correction code decoding of the soft-decision inner error correction code decoded data and determining if the encoded data was successfully decoded by the soft-decision inner error correction code decoding and the outer error correction code decoding; and
   if it is determined that the encoded data was not successfully decoded by the soft-decision inner error correction code decoding and the outer error correction code decoding, performing a redundant array of independent disks (RAID) operation of the encoded data.

2. The method of claim 1, wherein the inner error correction code is a low-density parity-check (LDPC) code.

3. The method of claim 1, wherein the inner error correction code is a quasi-cyclic low-density parity-check (LDPC) code.

4. The method of claim 1, wherein the outer error correction code is a Bose-Chaudhuri-Hocquenghem (BCH) code.

5. The method of claim 1, wherein receiving encoded data from a nonvolatile memory storage module at a nonvolatile memory controller further comprises, reading a flash page comprising the data and the outer error correction code for encoding the data from the nonvolatile memory storage module.

6. The method of claim 5, wherein the flash page is read a plurality of times for performing the soft-decision inner error correction code decoding.

7. The method of claim 1, wherein receiving encoded data from a nonvolatile memory storage module at a nonvolatile memory controller further comprises, reading a first flash page comprising the data and the outer error correction code for encoding the data and reading a second flash page comprising the inner error correction code for encoding the data from the nonvolatile memory storage module.

8. The method of claim 7, wherein the first flash page and the second flash page are each read a plurality of times for performing the soft-decision inner error correction code decoding.

9. The method of clam 1, wherein performing an outer error correction code decoding of the hard-decision inner error correction code decoded data and determining if the encoded data was successfully decoded by the hard-decision inner error correction code decoding and the outer error correction code decoding, further comprises:
   detecting a number of errors in the hard-decision inner error correction code decoded data;
   correcting the number of errors detected in the hard-decision inner error correction code decoded data if the number of errors does not exceed a correction capacity of the outer error correction code decoding; and
   determining that the encoded data was not successfully decoded by the hard-decision inner error correction code decoding and the outer error correction code decoding if the number of errors detected in the hard-decision inner error correction code decoded data exceeds the correction capacity of the outer error correction code decoding.

10. The method of claim 9, wherein detecting a number of errors in the hard-decision inner error correction code decoded data, further comprises:
   calculating syndromes of the hard-decision inner error correction code decoded data; and
   determining that errors have been detected in the hard-decision inner error correction code decoded data if at least one syndrome is non-zero.

11. The method of claim 1, wherein performing an outer error correction code decoding of the soft-decision inner error correction decoded data and determining if the encoded data was successfully decoded by the soft-decision inner error correction code decoding and the outer error correction code decoding further comprises:
   detecting a number of errors in the soft-decision inner error correction code decoded data;
   correcting the number of errors detected in soft-decision inner error correction code decoded data if the number of errors does not exceed a correction capacity of the outer error correction code decoding; and
   determining that the encoded data was not successfully decoded by the soft-decision inner error correction code decoding and the outer error correction code decoding if the number of errors detected in the soft-decision inner error correction code decoded data exceeds the correction capacity of the outer error correction code decoding.

12. The method of claim 11, wherein detecting a number of errors in the soft-decision inner error correction code decoded data further comprises:
calculating syndromes of the soft inner error correction code decoded data; and
determining that errors have been detected in the soft inner error correction code decoded data if at least one syndrome is non-zero.

13. A nonvolatile memory system comprising:
a nonvolatile memory storage module storing encoded data comprising an outer error correction code concatenated with an inner error correction code; and
a nonvolatile memory controller coupled to the nonvolatile memory storage module, the nonvolatile memory controller to recover data stored in the nonvolatile memory storage module by decoding the encoded data in the nonvolatile memory storage module using a hard-decision inner error correction code decoding and an outer error correction code decoding and if the encoded data is not successfully decoded by the hard-decision inner error correction code decoding and the outer error correction code decoding, decoding the data in the nonvolatile memory storage module using a soft-decision inner error correction code decoding and the outer error correction code decoding and if the encoded data is not successfully decoded by the soft-decision inner error correction code decoding and the outer error correction code decoding, recovering the data from the nonvolatile memory storage module by performing a redundant array of independent disks (RAID) operation of the encoded data.

14. The nonvolatile memory storage system of claim 13, wherein the nonvolatile memory storage module storing encoded data comprising an outer error correction code concatenated with an inner error correction code comprises a first flash page storing the data and the outer error correction code and a second flash page storing the inner error correction code.

15. The system of claim 13, wherein the outer error correction code is a Bose-Chaudhuri-Hocquenghem (BCH) code.

16. The system of claim 13, wherein the inner error correction code is a low-density parity-check (LDPC) code.

17. The system of claim 13, wherein the inner error correction code is a quasi-cyclic low-density parity-check (LDPC) code.

18. The system of claim 13, wherein the nonvolatile memory storage module is a NAND flash memory module.

19. The system of claim 13, wherein the nonvolatile memory system is a solid state drive (SSD).

20. The system of claim 13, wherein the nonvolatile memory controller further comprises, an error detection and correction module for recovering the data, the error detection and correction module comprising:
a hard-decision inner error correction code decoder for decoding the data using the hard-decision inner error correction code decoding;
a soft-decision inner error correction code decoder using a soft-decision algorithm for decoding the data using the soft-decision inner error correction code decoding; and
an outer error correction code decoder coupled to the hard-decision inner error correction code decoder and the soft-decision inner error correction code decoder, the outer error correction code decoder to decode the data using the outer error correction code decoding and to determine if the encoded data has been successfully decoded.

21. The system of claim 20, wherein the nonvolatile memory controller further comprises, a redundant array of independent disks (RAID) control module coupled to the error detection and correction module.

22. The system of claim 20, wherein the hard-decision inner error correction code decoder and the soft-decision inner error correction code decoder are the same decoder.

23. A nonvolatile memory controller comprising:
an error detection and correction module to receive encoded data stored in a nonvolatile memory storage module, the encoded data comprising a low density parity check (LDPC) inner error correction code concatenated with a Bose-Chaudhuri-Hocquenghem (BCH) outer error correction code, the error detection and correction module to recover the data stored in the nonvolatile memory storage module by recovering the data from the nonvolatile memory storage module using a hard-decision LDPC inner error correction code decoding and a BCH outer error correction code decoding and if the encoded data is not successfully decoded by the hard-decision LDPC inner error correction code decoding and the BCH outer error correction code decoding, recovering the data from the nonvolatile memory storage module using a soft-decision LDPC inner error correction code decoding and the BCH outer error correction code decoding; and
a redundant array of independent disks (RAID) control module coupled to the error detection and correction module, the RAID controller to perform a RAID operation to recover the data from the nonvolatile memory storage if the encoded data is not successfully decoded by the soft-decision LDPC inner error correction code decoding and the BCH outer error correction code decoding.

* * * * *